(12) United States Patent
Ibbetson et al.

(10) Patent No.: US 9,142,734 B2
(45) Date of Patent: Sep. 22, 2015

(54) COMPOSITE WHITE LIGHT SOURCE AND METHOD FOR FABRICATING

(75) Inventors: James Ibbetson, Santa Barbara, CA (US); Eric Tarsa, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/786,755

(22) Filed: Feb. 24, 2004

(65) Prior Publication Data

US 2005/0093430 A1    May 5, 2005

Related U.S. Application Data

(60) Provisional application No. 60/451,067, filed on Feb. 26, 2003.

(51) Int. Cl.
| H01J 1/62 | (2006.01) |
| H01L 33/50 | (2010.01) |
| H01L 33/58 | (2010.01) |
| H01L 33/62 | (2010.01) |

(52) U.S. Cl.
CPC ............ *H01L 33/505* (2013.01); *H01L 33/507* (2013.01); *H01L 33/58* (2013.01); *H01L 33/62* (2013.01); *H01L 2924/0002* (2013.01); *H01L 2933/0041* (2013.01)

(58) Field of Classification Search
USPC .......................................... 313/512; 257/100
See application file for complete search history.

(56) References Cited

U.S. PATENT DOCUMENTS

| 4,476,620 | A | 10/1984 | Ohki et al. ...................... 438/33 |
| 5,094,185 | A | 3/1992 | Simopoulos et al. |
| 5,813,753 | A | 9/1998 | Virens et al. ................... 362/293 |
| 5,959,316 | A | 9/1999 | Lowery ............................ 257/98 |
| 5,998,925 | A | 12/1999 | Shimizu et al. ................ 313/503 |
| 6,066,861 | A | 5/2000 | Hohn et al. ....................... 257/99 |
| 6,204,523 | B1 * | 3/2001 | Carey et al. ....................... 257/98 |
| 6,222,207 | B1 | 4/2001 | Carter-Coman et al. ........ 257/98 |
| 6,245,259 | B1 | 6/2001 | Hoehn |
| 6,252,254 | B1 | 6/2001 | Soules |
| 6,277,301 | B1 | 8/2001 | Hohn et al. .............. 252/301.36 |

(Continued)

FOREIGN PATENT DOCUMENTS

| CN | 2535926 | 12/2003 |
| CN | 1624944 | 6/2005 |

(Continued)

OTHER PUBLICATIONS

Nichia Corporation White LED, "High Brightness LEDs", Part Nos. NSPW300BS, N8PW312BS 2000, p. 1-3.

(Continued)

*Primary Examiner* — Andrew Coughlin
(74) *Attorney, Agent, or Firm* — Koppel, Patrick, Heybl & Philpott

(57) ABSTRACT

An emitter includes a light source and a separately formed conversion material region with conversion particles. The light source is capable of emitting light along a plurality of light paths extending through the conversion material region where at least some of the light can be absorbed by the conversion particles. The light from the light source and the light re-emitted from the conversion particles combine to provide a desired color of light. Each light path extends through a substantially similar amount of conversion particles so that the desired color of light has a substantially uniform color and intensity along each light path.

44 Claims, 4 Drawing Sheets

(56) References Cited

U.S. PATENT DOCUMENTS

| | | | |
|---|---|---|---|
| 6,346,771 B1 | 2/2002 | Salam | 313/499 |
| 6,486,499 B1 | 11/2002 | Krames et al. | 257/81 |
| 6,495,862 B1 | 12/2002 | Okazaki et al. | 257/103 |
| 6,576,930 B2 | 6/2003 | Reeh et al. | 257/98 |
| 6,610,598 B2 | 8/2003 | Chen | |
| 6,653,661 B2 * | 11/2003 | Okazaki | 257/98 |
| 6,686,676 B2 | 2/2004 | McNulty et al. | 323/112 |
| 6,784,460 B2 | 8/2004 | Ng et al. | 257/95 |
| 6,821,804 B2 | 11/2004 | Thibeault et al. | 438/29 |
| 6,891,330 B2 * | 5/2005 | Duggal et al. | 313/511 |
| 6,919,586 B2 * | 7/2005 | Fujii | 257/100 |
| 7,009,199 B2 | 3/2006 | Hall | 257/14 |
| 7,066,626 B2 | 6/2006 | Omata | |
| 7,244,630 B2 | 7/2007 | Krames et al. | 438/47 |
| 7,279,345 B2 | 10/2007 | Camras | |
| 7,633,097 B2 | 12/2009 | Kim et al. | |
| 7,635,915 B2 | 12/2009 | Xie et al. | 257/692 |
| 2001/0000622 A1 * | 5/2001 | Reeh et al. | 257/98 |
| 2001/0050371 A1 * | 12/2001 | Odaki et al. | 257/98 |
| 2002/0001192 A1 | 1/2002 | Suehiro et al. | 362/240 |
| 2002/0028527 A1 | 3/2002 | Maeda et al. | |
| 2002/0063520 A1 | 5/2002 | Yu et al. | |
| 2002/0070449 A1 | 6/2002 | Yagi et al. | |
| 2002/0123164 A1 | 9/2002 | Slater, Jr. et al. | 438/39 |
| 2002/0153835 A1 | 10/2002 | Fujiwara et al. | |
| 2002/0163302 A1 | 11/2002 | Nitta et al. | |
| 2002/0171911 A1 | 11/2002 | Maegawa | |
| 2002/0185965 A1 | 12/2002 | Collins, III et al. | |
| 2002/0185966 A1 | 12/2002 | Murano | 313/501 |
| 2003/0025449 A1 | 2/2003 | Rossner | |
| 2003/0030060 A1 | 2/2003 | Nishioka et al. | |
| 2003/0151361 A1 | 8/2003 | Ishizaka | |
| 2003/0168670 A1 | 9/2003 | Roberts et al. | 257/98 |
| 2003/0209714 A1 | 11/2003 | Taskar et al. | |
| 2003/0230751 A1 | 12/2003 | Harada | |
| 2004/0190304 A1 | 9/2004 | Sugimoto et al. | |
| 2004/0245543 A1 | 12/2004 | Yoo | 257/103 |
| 2005/0082562 A1 | 4/2005 | Ou et al. | 257/103 |
| 2005/0121688 A1 | 6/2005 | Nagai et al. | |
| 2005/0184298 A1 | 8/2005 | Ueda | 257/79 |
| 2005/0205974 A1 | 9/2005 | Su et al. | |
| 2005/0242364 A1 | 11/2005 | Moustakas et al. | 257/103 |
| 2005/0248271 A1 | 11/2005 | Ng et al. | |
| 2006/0002101 A1 | 1/2006 | Wheatley et al. | |
| 2006/0011935 A1 | 1/2006 | Krames et al. | 257/99 |
| 2006/0060888 A1 | 3/2006 | Kim et al. | |
| 2006/0145170 A1 | 7/2006 | Cho | |
| 2006/0255341 A1 | 11/2006 | Pinnington et al. | 257/79 |
| 2006/0255347 A1 | 11/2006 | Thibeault et al. | 257/79 |
| 2006/0284207 A1 | 12/2006 | Park et al. | 257/99 |
| 2008/0042151 A1 | 2/2008 | Oh et al. | 257/88 |
| 2009/0278148 A1 | 11/2009 | Nabekura et al. | 257/98 |

FOREIGN PATENT DOCUMENTS

| | | | |
|---|---|---|---|
| CN | 101366126 | 2/2009 | |
| CN | 101405646 | 4/2009 | |
| CN | 101553936 | 10/2009 | |
| CN | 101636851 | 1/2010 | |
| EP | 1168902 A2 | 1/2002 | H05K 5/00 |
| EP | 1191608 A | 3/2002 | |
| EP | 1198016 A2 | 4/2002 | |
| EP | 1418628 A | 5/2004 | |
| EP | 1641049 A1 | 3/2006 | |
| GB | 1376086 | 12/1974 | |
| JP | 508494 | 1/1975 | |
| JP | 5298384 | 7/1977 | |
| JP | S0106175 | 6/1985 | |
| JP | 6194362 | 6/1986 | |
| JP | S61144890 | 7/1986 | |
| JP | 6214481 | 1/1987 | |
| JP | 62143942 | 9/1987 | |
| JP | 646038 | 1/1989 | |
| JP | 01230274 | 9/1989 | |
| JP | H01139664 | 9/1989 | |
| JP | 01287973 | 11/1989 | |
| JP | 04028269 | 1/1992 | H01L 33/00 |
| JP | 440555 | 4/1992 | |
| JP | 05327012 | 12/1993 | |
| JP | 06104463 | 4/1994 | |
| JP | H06177427 | 6/1994 | |
| JP | 06275866 | 9/1994 | |
| JP | 7193281 A | 7/1995 | |
| JP | 08213660 | 8/1996 | |
| JP | 09083018 | 3/1997 | |
| JP | H09138402 | 5/1997 | |
| JP | 09181359 | 7/1997 | |
| JP | 10190065 | 7/1998 | |
| JP | H10190065 | 7/1998 | |
| JP | 10233532 | 9/1998 | |
| JP | 11026808 | 1/1999 | |
| JP | H11177129 | 7/1999 | |
| JP | 11284234 | 10/1999 | |
| JP | 200031532 | 1/2000 | |
| JP | 2000031548 | 1/2000 | |
| JP | 2000031548 A * | 1/2000 | |
| JP | 2000208818 A | 7/2000 | |
| JP | 2000208822 A | 7/2000 | |
| JP | 2000223749 A | 8/2000 | |
| JP | 2001000043 | 1/2001 | |
| JP | 2001148514 A * | 5/2001 | |
| JP | 2001177153 | 6/2001 | |
| JP | 2001203396 | 7/2001 | |
| JP | 2001267632 | 9/2001 | |
| JP | 2002076443 | 3/2002 | |
| JP | 2002-141556 | 5/2002 | |
| JP | 2002141556 | 5/2002 | |
| JP | 2002203989 | 7/2002 | |
| JP | 2002217450 | 8/2002 | |
| JP | 2002261333 | 9/2002 | |
| JP | 2002289923 | 10/2002 | |
| JP | U3091911 | 11/2002 | |
| JP | 2002353516 | 12/2002 | |
| JP | 20022368277 | 12/2002 | |
| JP | 2003017756 | 1/2003 | |
| JP | 2003036707 | 2/2003 | |
| JP | 2003037297 | 2/2003 | |
| JP | 2003046140 | 2/2003 | |
| JP | 2003-110146 | 4/2003 | |
| JP | 2003110146 | 4/2003 | |
| JP | 2003234509 | 8/2003 | |
| JP | 2003347601 | 12/2003 | |
| JP | 2004071357 | 3/2004 | |
| JP | 1492521 A | 4/2004 | |
| JP | 2004152808 | 5/2004 | |
| JP | 2004238441 | 8/2004 | |
| JP | 2004266124 | 9/2004 | |
| JP | 2004363343 | 12/2004 | |
| JP | 20044363537 | 12/2004 | |
| JP | 2005026276 | 1/2005 | |
| JP | 2005045199 | 2/2005 | |
| JP | 2005050838 | 2/2005 | |
| JP | 2005109212 | 4/2005 | |
| JP | 2005123238 | 5/2005 | |
| JP | 2005166937 | 6/2005 | |
| JP | 2005166941 | 6/2005 | |
| JP | 20055191192 | 7/2005 | |
| JP | 2005209852 | 8/2005 | |
| JP | 2005244152 | 9/2005 | |
| JP | 2005303012 | 10/2005 | |
| JP | 2005303211 | 10/2005 | |
| JP | 2005340750 | 12/2005 | |
| JP | 2005353816 | 12/2005 | |
| JP | 2006036930 | 2/2006 | |
| JP | 2006086254 | 3/2006 | |
| JP | 2006114909 | 4/2006 | |
| JP | 2006191103 | 7/2006 | |
| JP | 2006216717 | 8/2006 | |
| JP | 2006229109 | 8/2006 | |
| JP | 2006278675 | 10/2006 | |
| JP | 2006339362 | 12/2006 | |
| JP | 2006352061 | 12/2006 | |
| JP | 2007005091 | 1/2007 | |

(56) References Cited

FOREIGN PATENT DOCUMENTS

| | | |
|---|---|---|
| JP | 2007080885 | 3/2007 |
| JP | 2007110053 | 4/2007 |
| JP | 2007150331 | 6/2007 |
| JP | 2007180430 | 7/2007 |
| JP | 2007227679 | 9/2007 |
| JP | 2007273763 | 10/2007 |
| JP | 2007300106 | 11/2007 |
| JP | 2008300562 | 12/2008 |
| JP | 2000-031548 | 1/2010 |
| JP | 2011061230 | 3/2011 |
| KR | 20040087950 | 10/2004 |
| TW | 506145 | 10/2002 |
| TW | 511782 | 11/2002 |
| TW | 524391 | 3/2003 |
| TW | 536842 | 6/2003 |
| TW | 546859 | 8/2003 |
| WO | WO 02061897 | 8/2002 |
| WO | WO 03/010832 | 2/2003 |
| WO | WO 03010832 | 2/2003 |
| WO | WO 03010832 A | 2/2003 |
| WO | WO 03010832 A1 | 6/2003 |
| WO | WO 03065464 | 8/2003 |
| WO | 2005031882 | 4/2005 |
| WO | 2005112137 | 11/2005 |
| WO | WO 2005112137 | 11/2005 |
| WO | WO 2006099741 | 9/2006 |

OTHER PUBLICATIONS

China Publication No. CN1372330, Oct. 2, 2002, Wang Wangnan et al.
Office Action From China, Chinese Patent Application No. 200480011028.X, Dec. 14, 2007.
Decision on Rejection from China dated: Sep. 1, 2008.
Office Action From China Apr. 28, 2008.
Fourth Office Action from related Chinese Application No. 200480011028.X, dated: Jul. 7, 2009.
Office Action from related Taiwan Patent Application No. 093104924, dated: Nov. 23, 2009.
The Japan Society of Applied Physics, vol. 44, No. 21, pp. 649-651, "Strongly Enhanced Phosphor Efficiency in GaInN White Light-Emitting Diodes Using Remote Phosphor Configuration and Diffuse Reflector Cut", Kim et al., May 11, 2005.
Decision in counterpart Taiwan Patent Application No. 093104924 issued Nov. 9, 2010.
Notice Requesting Submission of Opinion from counterpart Korean Patent Application No. 10-2005-7015844 mailed Nov. 16, 2010.
Official Notice of Rejection for counterpart Japanese Patent Application No. 2006-503876 mailed Jun. 15, 2010.
Office Action of the IPO for counterpart Taiwan Patent Application No. 093104924 issued Jun. 2, 2011.
Decision of Rejection for counterpart Japanese Patent Application No. 2006-503876 dated Apr. 26, 2011.
Notice of Decision of Final Rejection for counterpart Korean Patent Application No. 10-2005-7015844 dated Jul. 29, 2011.
Invitation pursuant to Article 94(3) and Rule 71(1) EPC, Application No. 04 714 213.8-1235, dated Feb. 29, 2012.
Extended European Search Report from Application No. 10181251.9-1235/2262006. dated: Feb. 17, 2012.
Re-Examination Decision of the IP Office from Taiwan Patent Appl. No. 093104924, dated: Dec. 15, 2011.
Notice of Rejection from Japanese Patent Application No. 2006-50386, dated Jun. 19, 2012.
MOEA Decision from Taiwanese Patent Application No. 10106103990, dated Apr. 26, 2012.
Appeal Decision from Korean Patent Application No. 10-2005-7015844, dated Sep. 25, 2012.
First Examination Report from European Patent Application No. 10 181 251.9-1235, dated Oct. 25, 2012.
Notice of Final Rejection from Korean Patent Application No. 10-2011-7028750, dated Nov. 9, 2012.
Notice of Rejection from Japanese Patent Application No. 2010-254633, dated Sep. 18, 2012.
Office Action from Taiwanese Patent Application No. 100145116, dated Oct. 24, 2012.
Notice of Reasons for Rejection from Japanese Patent Appl. No. 2010-254633, dated Jan. 15, 2013.
Office Action from Korean Application No. 10-2011-7028750, dated Mar. 28, 2012.
Decision to Refuse a European Patent Application from European Patent Appl. No. 10 181 251.9-1555, dated Apr. 22, 2014.
Office Action from U.S. Appl. No. 12/002,249, dated Feb. 26, 2014.
Minutes from European Patent Office No. 10 181 251.9 dated Apr. 22, 2014.
Office Action from Taiwanese Patent Appl. No. 103202911 dated Apr. 1, 2014.
Office Action from Korean Application 10-2006-7017800, dated Feb. 27, 2014 (Myers).
Office Action from U.S. Appl. No. 11/523,381, dated Apr. 11, 2014.
Office Action from U.S. Appl. No. 11/738,665, dated May 1, 2014.
Office Action and Search Report from Taiwanese Patent appl. No. 100145116, dated Apr. 10, 2013.
Decision of Rejection from Japanese Patent Appl. No, 2010-254633, dated Jun. 4, 2013.
Reasons of Rejection from Japanese Patent Appl. No. 2006-533962, dated Jun. 3, 2014.
Decision of Patent Grant from Japanese Patent Appl. No. 2007-520314, dated Jun. 3, 2014.
Reasons for Rejection from Japanese Patent Appl. No. 2011-150211, dated May 14, 2014.
Decision of Rejection from Japanese Patent Appl. No, 2012-288056, dated Jun. 3, 2014.
Decision of Dismissal of Appeal against Final Rejection from Korean Patent Appl. No. 10-2011-7028750, dated Jun. 11, 2014.
Official Action from European Patent Appl. No. 05761972.8, dated Mar. 8. 2013 (received Jul. 3, 2013).
Office Action and Search Report from Taiwanese Patent Appl. No. 094121086, dated May 15, 2013.
Streubel, et al. , "High Brightness AlGaInP Light-Emitting Diodes", IEEE Journal of Selected Topics in Quantum Electronics. vol. 8, No. 2, pp. 324-325, Mar./Apr. 2002.
Office Action from Japanese Patent appl. No. 2012-232743, dated Jun. 25, 2013.
Decision of Final Rejection from Japanese Patent Appl. No. 2011-248746, dated Jun. 12, 2013 (Received Aug. 27, 2013).
Reasons for Rejection from Japanese Patent Appl. No. 2011-150211, dated Aug. 26, 2013.
Reasons for Rejection from Japanese Patent Appl. No. 2011-229090, dated Aug. 27, 2013.
Reasons for Rejection from Japanese Patent Appl. No. 2009-507696, dated Aug. 20, 2013.
Third Office Action from Chinese Patent Appl. No. 200810186835.5. dated Aug. 22, 2013.
Reasons for Rejection from Japanese Patent Appl. No. 2012-232744, dated Jun. 26, 2013 (received Sep. 5, 2013).
Office Action from U.S. Appl. No. 11/708,990, dated Jul. 11, 2013.
Office Action from U.S. Appl. No. 10/836,743, dated Aug. 22, 2013.
Reasons for Rejection from Japanese Patent Appl. No. 2006-513442, dated Sep. 9, 2013.
Notification of Reasons for Rejection from Japanese Patent Appl. No 2008-309821, dated Sep. 2013.
Office Action from U.S. Appl. No. 11/738,665, dated Nov. 8, 2013.
Office Action from U.S. Appl. No. 12/845,629, dated Sep. 24, 2013.
Final Notification of Reasons for Rejection from Japanese Patent Appl. No. 2006-513442, dated Feb. 13. 2014.
Examination from European Patent Appl. No. 07754938.4-1564. dated Mar. 18, 2014.
Reasons of Rejection from Japanese Patent appl No. 2011-229090. dated Mar. 3, 2014.
Reasons of Rejection from Japanese Patent appl. No. 2012-20751, dated Feb. 13, 2014.
Office Action from U.S. Appl. No. 10/836,743, dated Nov. 19, 2013.
Office Action from U.S. Appl. No. 12/845,629, dated Feb. 11, 2014.
Office Action from U.S. Appl. No. 11/708,990, dated Feb. 12, 2014.

(56) References Cited

OTHER PUBLICATIONS

Examination Report from European Patent Appl. No. 04788908.4-1901, dated Jan. 9, 2014.
Interrogation from Japanese Patent Appl. No. 2006-533962, dated Dec. 10, 2013.
First Office Action from Chinese Patent Appl No. 201110379964.8. dated Nov. 22, 2013.
Notice of Reasons for Rejection from Japanese Patent Appl. No. 2012-288056, dated Dec. 10, 2013.
Office Action from Japanese Patent Appl. No. 2012-232743, dated Nov. 20, 2013.
Office Action from Japanese Patent Appl. No. 2012-232744, dated Nov. 20, 2013.
Reasons for Rejection from Japanese Patent Appl. No. 2010-254633, dated Dec. 24, 2013.
Reasons for Rejection from Japanese Patent Appl. No. 2012-274904, dated Jan. 7, 2014.
Re-Examination from Taiwanese Patent Appl. No. 100145116, dated Dec. 19, 2013.
Office Action from Japanese Patent Appl. No. 2007-520314, dated Nov. 12, 2013.
Office Action from Taiwanese Patent Appl. No. 094121086, dated Dec. 10, 2013.
Office Action and Search Report from Taiwanese Appl. No. 101138314, dated Aug. 5, 2014.
Office Action from Taiwanese Appl. No. 093112133, dated Jul. 25, 2014.
Notification to Grant from Chinese Patent Appl. No. 200810186835.5, dated Aug. 25, 2014.
Office Action from U.S. Appl. No. 10/836,743, dated Sep. 2, 2014.
Translation from Japanese to English of Kaizu, M. (JP-(H)04-(0)28269), "Mounting Structure for an LED Bare Chip", published Jan. 30, 1992; prepared by the Translations Branch at the U.S. Patent and Trademark Office.
Official Action from Japanese Patent Appl. No. 2011-248746, dated Aug. 4, 2014.
Decision of Dismissal of Amendment from Japanese Patent Appl. No 2011-229090, dated Jul. 29, 2014.
Second Office Action from Chinese Patent Appl. No. 2011103799648, dated Jul. 11, 2014.
Decision of Rejection from Japanese Patent Appl. No. 2012-274904, dated Jul. 1, 2014.
Intention to Grant from European Patent Application No. 04788908.4-191, dated Jul. 14, 2014.
Office Action from Chinese Patent Appl. No. 201210252142.8, dated May 23, 2014.
Summary of the Appeal Decision from Japanese Patent Appl. No. 2008-309821, dated Jun. 28, 2014.
Office Action from U.S. Appl. No. 10/836,743, dated May 28, 2014.
Response to OA from U.S. Appl. No. 10/836,743, filed Jul. 28, 2014.
Office Action from U.S. Appl. No. 12/002,429, dated May 30, 2014.
Response to OA from U.S. Appl. No 12/002,429, filed Jul. 10, 2014.
Office Action from U.S. Appl. No. 11/523,381, dated Jul. 2, 2014.
Decision of Rejection from Japanese Patent Appl. No. 2013-509039, dated Oct. 7, 2014.
Final Notification of Reasons for Rejection from Japanese Patent Appl. No. 2011-248746, dated Jan. 13. 2015.
Third Office Action from Chinese Patent Appl. No. 2011-103799648, dated Jan. 13, 2015.
Pretrial Report from Japanese Patent Appl. No. 2012-288056, dated Jan. 21, 2015.
Notice of Prelim. Pre-Appeal Examination from Japanese Patent Appl. No. 2012-247904, dated Feb. 10, 2015.
Office Action from Japanese Patent Appl. No. 2013-16358, dated Mar. 10, 2015.
Notice of Allowance from Taiwanese Patent Appl. No. 101138314, dated Mar. 18, 2015.
Notice of Allowance from Taiwanese Patent Appl. No. 093112133, dated Feb. 17, 2015.
Petition from Japanese Patent Appl. No. 2014-14901, dated Mar. 11, 2015.
Office Action from U.S. Appl. No. 10/836,743, dated Jan. 30, 2015.
Computerized translation from AINP (JPO) of Hashimoto et al, "Light-emitting device and Method of Manufacturing the same". (JP2003-046140), (Feb. 14, 2003) submitting as Office appendix.
Office Action from U.S. Appl. No. 11/708,990, dated Feb. 13, 2015.
Office Action from U.S. Appl. No. 11/523,381, dated Mar. 13, 2015.
Decision of Rejection from Japanese Patent Appl. No. 2011-150211, dated Oct. 14, 2014.
Examination Report from European Patent Appl. No. 08 170 514.7-1564, dated Nov. 12, 2014.
Decision of Re-Examination from Chinese Appl. No. 200910137491.3, dated Nov. 21, 2014.
Examiner's Reconsideration Report from Japanese Appl. No. 2012-232743, dated Nov. 10, 2014.
Examiner's Reconsideration Report from Japanese Appl. No. 2012-232744, dated Nov. 11, 2014.
Office Action from Chinese Appl. No. 201210252142.8, dated Dec. 11, 2014.
Summary of Pretrial Report from Japanese Appl. No. 2011-229090, dated Dec. 19, 2014.
Translated Office Action from Taiwanese Appl. No. 099121883, dated Nov. 13, 20144.
First Office Action and Search Report from Chinese Appl. No. 2011800219066, dated Dec. 26, 2014.
Office Action from U.S. Appl. No. 12/002,429, dated Nov. 12, 2014.
Office Action from U.S. Appl. No. 11/738,665, dated Nov. 28, 2014.
Office Action from U.S. Appl. No. 11/523,381, dated Dec. 8, 2014.
Trial Decision and Notice of Allowance from Japanese Patent Appl. No. 2013-16358, dated Apr. 14, 2015.
Official Action from Japanese Patent Appl. No. 2012-232743 dated Apr. 20. 2015.
Official Action from Japanese Patent Appl. No. 2012-232744. dated Apr. 20, 2015.
Office Action from U.S. Appl. No 11/708,990, dated Jul. 11, 2013.
Office Action from U.S. Appl. No. 12/002,429, dated Aug. 9, 2013.
Office Action from U.S. Appl. No. 10/836,743. dated Aug. 22, 2013.
Office Action from U.S. Appl. No. 11/523,381, dated Sep. 17, 2013.
Office Action from Japanese Appl. No. 2011-229090, dated Jun. 2, 2015.
Fourth Office Action from Chinese Patent Appl. No. 2009101374913. dated Apr. 21, 2015.
Office Action from U.S. Appl. No. 12/002,429, dated May 7, 2015.
Office Action from U.S Appl. No. 11/738,665, dated May 11, 2015.
Office Action from U.S. Appl. No. 10/836.743, dated May 26, 2015.
Appeal Decision in Japanese Patent Appl. No. 2012-274904, dated Jun. 23, 2015.
Certificate of Patent for Japanese Patent Appl. No. 2006-533962, dated May 22. 2015.
Notice of Issuance from Chinese Patent Appl. No. 201210252142.8, dated Jun. 3, 2015.
Fourth Office Action from Chinese Patent Appl. No. 2011103799648, dated Jul. 14, 2015.
Reasons for Rejection from Japanese Patent Appl. No. 2011-229090, dated Jun. 2, 2015.

* cited by examiner

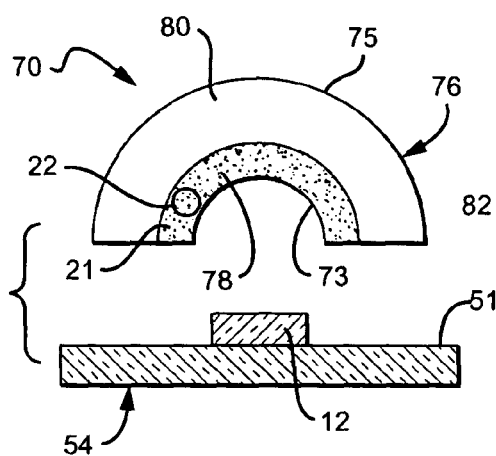
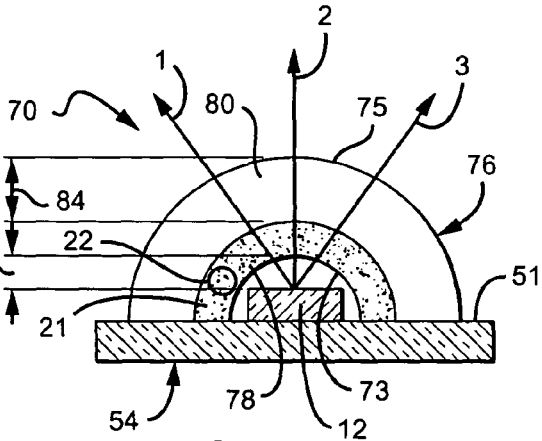
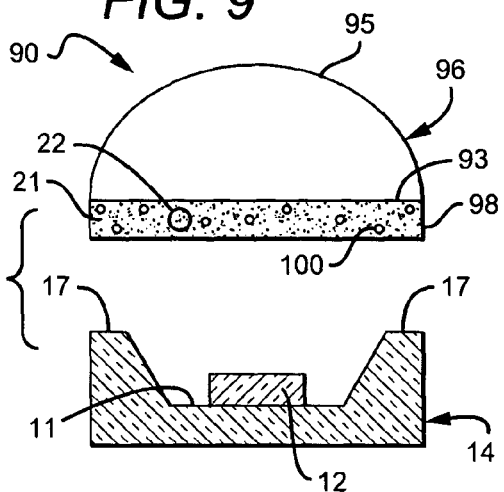
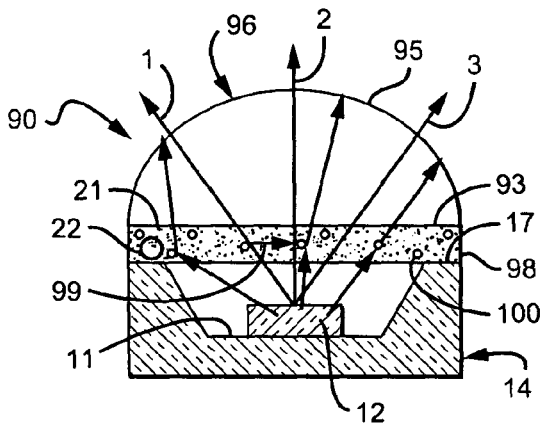
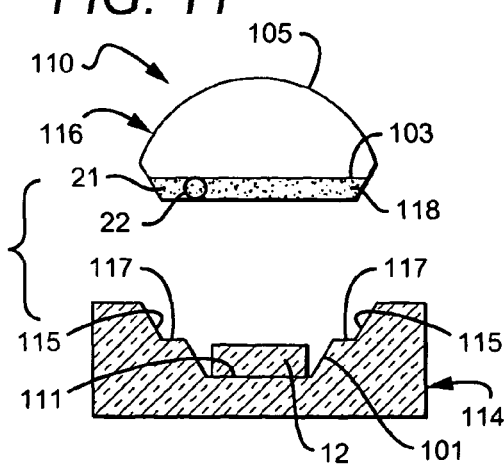
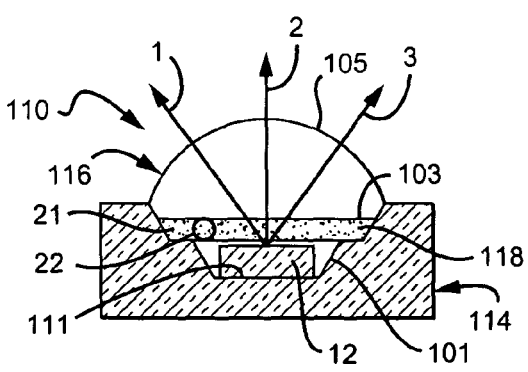

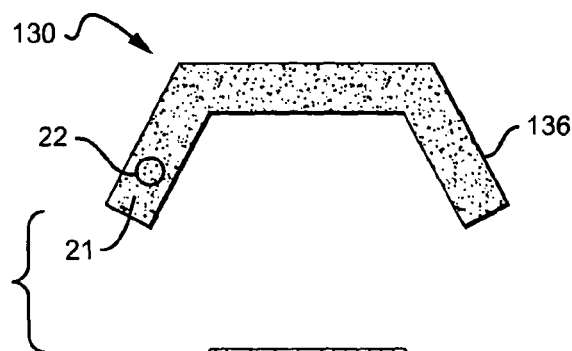
FIG. 13
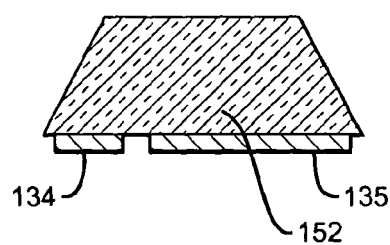
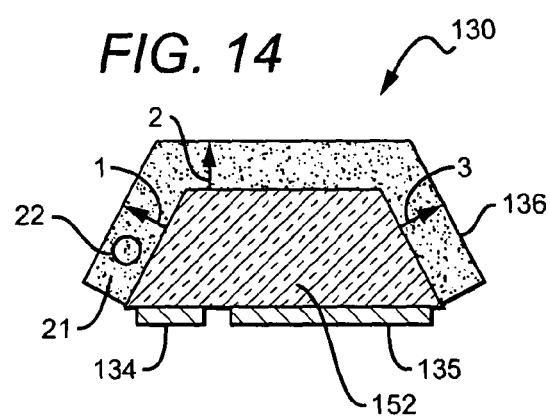
FIG. 14
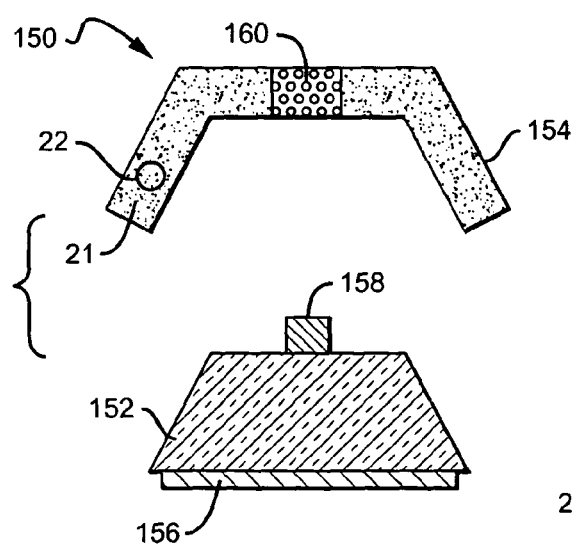
FIG. 15
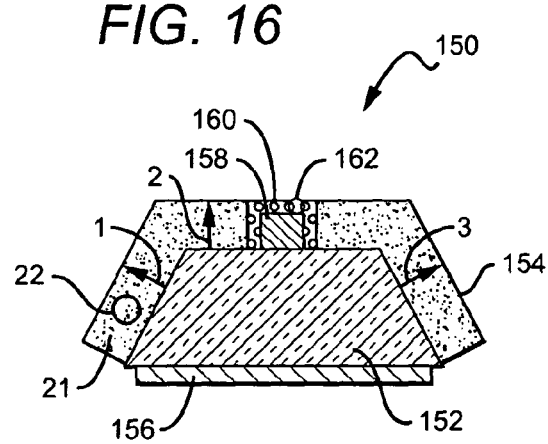
FIG. 16

COMPOSITE WHITE LIGHT SOURCE AND METHOD FOR FABRICATING

This application claims the benefit of U.S. Provisional Application Ser. No. 60/451,067 filed Feb. 26, 2003.

BACKGROUND OF THE INVENTION

1. Field of the Invention

This invention relates to light emitters and, more particularly, to light emitters where the wavelength of at least some of the emitted light is converted to another wavelength by a conversion material region.

2. Description of the Related Art

Light emitting diodes (LEDs) are an important class of solid-state devices that convert electric energy to light energy and generally comprise an active layer of semiconductor material sandwiched between two oppositely doped layers. When a bias is applied across the doped layers, holes and electrons are injected into the active layer where they recombine to generate light. Light is typically emitted omnidirectionally from the active layer and from the surfaces of the LED.

One disadvantage of conventional LEDs used for lighting applications is that they cannot generate white light from their active layers. One way to cause a single blue emitting LED to emit white light is to surround it with a yellow phosphor, polymer or dye. [See Nichia Corp. white LED, Part No. NSPW300BS, NSPW312BS, etc.; See also U.S. Pat. No. 5,959,316 to Hayden, "Multiple Encapsulation of Phosphor-LED Devices"]. The surrounding material "downconverts" the wavelength of at least some of the light, changing its color. For example, if a blue emitting LED is surrounded by a yellow phosphor, then some of the blue light passes through the phosphor without being changed while the remaining light is downconverted to yellow. Hence, the LED emits both blue and yellow light, which combines to form a white light.

One conventional method for manufacturing an LED surrounded by a conversion material region is to mount the LED in a cup shaped submount with the necessary electrical connections to apply a bias to the LED. A syringe mechanism is filled with an optically clear and curable material (e.g. epoxy, silicone, sol gel, etc.) with the conversion material mixed in the material, where the conversion material typically includes phosphor particles. The syringe mixture is then injected into the submount, covering the LED and partially filling the submount. When the clear material is first injected into the cup, the conversion particles are generally uniformly mixed/suspended throughout the material. The clear material is then cured to form the conversion material region and the entire assembly is encased in a clear epoxy.

One disadvantage of this manufacturing method is that under certain circumstances the conversion particles can be non-uniformly distributed in the cured state. After the clear material mixture is injected into a cup, there can be a time delay before it is cured. During this delay, the conversion particles can settle toward the base of the cup and over the LED such that there are different concentrations of particles throughout the conversion material region. This settling problem can be compounded in clear materials that become less viscous during the curing process, which allows the conversion particles to settle more quickly. The settled conversion material region can result in light from the emitter appearing as different colors when viewed from different angles because the emitted light encounters different amounts of conversion material.

Another disadvantage of this method is that the injection of the optically clear material from a syringe can introduce variations in the concentration of conversion particles from emitter to emitter, which can reduce the consistent reproducibility of the emitters. The conversion particles can settle in the syringe such that emitters injected with the clear material mixture when the syringe is full can have a greater concentration of conversion particles than emitters formed later. The amount of clear material injected from the syringe into the cup can also be difficult to control and different amounts of clear material mixture can be deposited in different emitters. This can also result in different amounts of conversion particles in different emitters. The end surface shape of the cured material can also vary such that light from different LEDs pass through different amounts of clear material and particles. These problems reduce the ability to manufacture emitters with consistent light emission characteristics.

Another disadvantage of the conventional emitter manufacturing method is the waste of material when the emitter does not meet the necessary emission standards. There is no practical method for separating the two so the entire emitter must be discarded if the emitter or the conversion material region is defective. Hence, if the LED is good but the conversion material region is defective, then both will be unusable. Discarding the entire emitter results in the excessive wasting of otherwise good LEDs, which can add to the overall cost of manufacturing.

SUMMARY OF THE INVENTION

The present invention provides an improved LED based emitter and method for fabricating an emitter that addresses the disadvantages of conventional emitters and methods. One embodiment of an emitter according to the present invention comprises a light source which emits a first spectrum of light. A conversion material region is included that is formed separately from said light source and includes conversion particles. The conversion material region is positioned in proximity to the light source such that at least some of the light source light passes through the conversion material region. The conversion particles absorb at least some of the light source light passing through the conversion material region and emit a second spectrum of light.

Another embodiment of an emitter according to the present invention comprises a light source which emits a first spectrum of light and a conversion material region formed separately from said light source. The conversion material region is positioned proximate to the light source and arranged to absorb at least some of the light emitted by the light source and re-emit light at a second spectrum of light. The emitter emits a combination of the first and second spectrums of light in a uniform third spectrum of light.

One embodiment of a method of fabricating an emitter according to the present invention comprises providing a light source and providing a separately formed conversion material region which includes conversion particles. The conversion material region is then bonded proximate to the light source. The conversion material region is positioned so that at least some of the light emitted from the light source at different angles flows through said conversion material region and through substantially the same amount of conversion particles.

These and other further features and advantages of the invention would be apparent to those skilled in the art from the following detailed description, taking together with the accompanying drawings, in which:

BRIEF DESCRIPTION OF THE DRAWINGS

FIG. 7 is a sectional view of another embodiment of an emitter according to the present invention having a dome shaped phosphor-containing lens;

FIG. 8 is a sectional view of the emitter of FIG. 7 with the separate pieces bonded together;

FIG. 9 is a sectional view of another embodiment of an emitter according to the present invention having a hemispheric lens with a phosphor-containing layer and scattering particles;

FIG. 10 is a sectional view of the emitter of FIG. 9 with the separate pieces bonded together;

FIG. 11 is a sectional view of another embodiment of an emitter according to the present invention having a generally hemispheric lens with a phosphor-containing layer;

FIG. 12 is a sectional view of the emitter of FIG. 11 with the separate pieces bonded together;

FIG. 13 is a sectional view of another embodiment of an emitter according to the present invention having a phosphor-loaded cap;

FIG. 14 is a sectional view of the emitter of FIG. 13 with the separate pieces bonded together;

FIG. 15 is a sectional view of another embodiment of an emitter according to the present invention having a perforated phosphor loaded cap;

FIG. 16 is a sectional view of the emitter of FIG. 15 with the separate pieces bonded together.

DETAILED DESCRIPTION OF THE INVENTION

Figure 1:
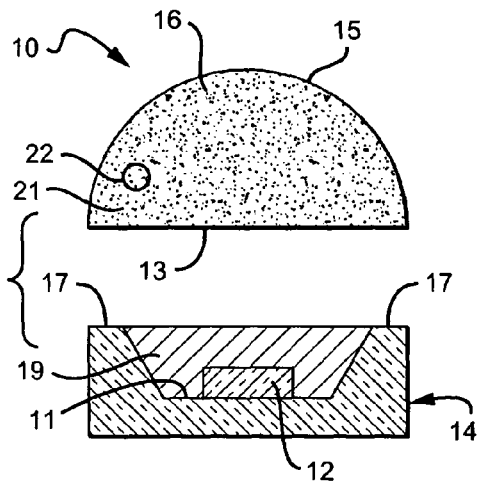
FIG. 1 is a sectional view of one embodiment of a light emitter according to the present invention having a hemispheric shaped phosphor-containing lens that is manufactured separately from the LED and submount.
Figure 2:
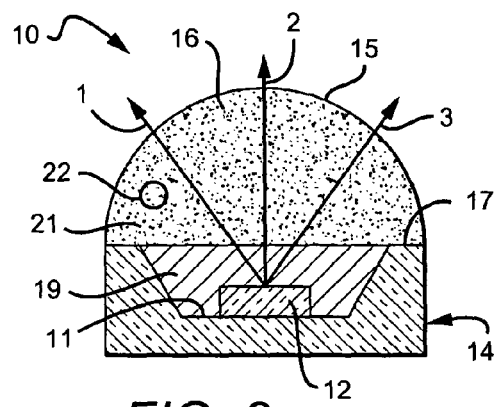
FIG. 2 is a sectional view of the emitter of FIG. 2, with the separate pieces bonded together.

FIGS. 1 and 2 illustrate one embodiment of a light emitter 10 in accordance with the present invention. Emitter 10 can be used in many different applications such as being included in a display system where it is desired to emit light at a uniform color and/or intensity through a range of angles. The system can include a single emitter or an array of emitters, but one emitter is illustrated here for simplicity and ease of discussion.

Emitter 10 includes a light source 12 positioned on a surface 11 of a cup shaped submount 14. Light source 12 can be mounted on surface 11 using known bonding methods. A filler material 19 is positioned on surface 11 and surrounds light source 12 so that filler material 19 fills the volume within the cup. A hemispheric lens 16, which includes phosphor, is positioned adjacent to submount 14. Lens 16 includes conversion particles 22 distributed throughout so that lens 16 and particles 22 form a conversion material region 21. Surface 11 can be reflective at the wavelengths of interest so that light emitted by light source 12 reflects from surface 11 and contributes to the light emission of emitter 10. It should be noted that conversion particles 22 are represented as dots in lens 16 as shown in FIGS. 1 and 2, and the rest of the figures shown in this disclosure.

A surface 13 of lens 16 bonds to filler material 19 and is held in place relative to submount 14. Hence, lens 16 is positioned so that a portion of the light emitted by light source 12 flows through lens 16 from surface 13 to a surface 15. However, filler material 19 is optional and lens 16 can be bonded directly to a surface 17 of submount 14. Filler material 19 can include an epoxy or another filler material capable of bonding lens 16 to submount 14. Lens 16 and filler material 19 can include a material transparent to the wavelengths of interest. Conversion particles 22 can include one or more fluorescent or phosphorescent materials such as a phosphor, a fluorescent dye, or a photoluminescent semiconductor material.

As shown, light source 12 includes a single light emitting diode (LED). However, light source 12 can include other light emitters, such as a solid-state laser, a laser diode, an organic light emitting diode, among others. The desired wavelengths of interest typically range from the infrared to the ultraviolet regions. Further, light source 12 can include multiple light sources which emit light at the same or different wavelengths.

The operation and fabrication details of conventional LEDs and other light emitters are known and are only briefly discussed. Conventional LEDs can be fabricated from a number of material systems by many known methods, with a suitable method being fabrication by Chemical Vapor Deposition (CVD). Other suitable methods include Molecular Beam Epitaxy (MBE) and Metal Organic Chemical Vapor Deposition (MOCVD).

LEDs typically include an active region sandwiched between two oppositely doped layers that are either doped p-type or n-type. The top layer of the LED is usually p-type and the bottom layer is usually n-type, although LEDs also work if the conductivities of the layers are reversed. The p- and n-type layers have respective contacts and an electrical signal can be applied across the contacts so that a current is injected into the active region to produce light emission.

Submount 14 can include electrical circuitry (not shown) coupled to light source 12, such as electrical circuitry to provide power for light emission. Submount 14 can also include components and circuitry to protect light source 12 from large electrical signals such as electrostatic shock.

In operation, light source 12 emits light at a desired wavelength where the emitted light flows through lens 16 either directly from the light source or indirectly by reflection from surface 11. A portion of the light emitted by light source 12 flows through lens 16 and is absorbed by conversion particles 22

A portion of the absorbed radiation is re-emitted at one or more wavelength spectrums which are generally different from the absorbed wavelength, with the re-emitted light typically having a longer wavelength than the absorbed light. The combination of the transmitted light and the retransmitted light allows the emitter 10 to emit different wavelengths of light than the original emitted light. For example, light source 12 can emit blue light and conversion particles 22 can absorb a portion of the blue light and convert it to yellow light. The emitter 10 then emits a white light combination of The blue and yellow light. A full range of broad yellow spectral emission is possible using conversion particles which include phosphors based on the $(Gd,Y)_3(Al,Ga)_5O_{12}$:Ce system. In another example, conversion particles 22 can re-emit green light, with a suitable green emitting material being a Sr:thiogallate phosphor. Other conversion particles can be used that absorb blue light and re-emit at different wavelengths of light. Different conversion particles can also be used that absorb different wavelengths of light and re-emit light at different wavelengths, such as particles the absorb ultra-violet light and emit light at a different wavelength.

In accordance with the invention, it is desired to distribute conversion particles 22 uniformly throughout lens 16 so that the color and the intensity of the emitted light is uniform throughout a wide range of viewing angles. Consequently, lens 16 is fabricated separately from submount 14 and light source 12. Hence, instead of injecting the clear material mixture which forms lens 16 into submount 14, material can be used to mass produce lenses using known methods such as injection molding or the conventional syringe manufacturing process. By fabricating lens 16 separately from submount 14 and light source 12, a number of advantages are realized that overcome problems associated with emitters manufactured using conventional methods.

One advantage is that the manufacturing process can provide lenses which are less expensive than conventional techniques. One reason the process is less expensive is because the formation of emitter 10 reduces the waste generated since light source 12 can be tested before lens 16 is bonded onto submount 14. If emitter 10 has substandard emission or is otherwise defective, then a determination can be made as to whether light source 12 or lens 16 is defective. The defective component can then be discarded and substituted with a new component. The replacement process avoids the waste associated with the conventional manufacturing processes where the entire emitter is discarded if the emission is substandard.

Another advantage is that the emitters can be formed with a more flexible manufacturing process. For example, different lenses can be used to match the geometry of submount 14 and light source 12. Also, the color emitted by a particular emitter 10 can be changed by using a lens which includes a different type of conversion particles to produce different light combinations. The changing of lenses can be done at the assembly line by simply substituting a different supply of lenses.

Flexibility in the manufacturing process is also obtained because a wider selection of materials can be used to form lens 16. For example, because the clear material is injected directly on the LED in the conventional syringe method, only material with a relatively low melting/curing temperature can be used. If higher temperature materials are used, then light source 12 or submount 14 can be damaged when contacted by the clear material mixture.

Lens 16 is manufactured separate from light source 12 and submount 14 and then bonded to submount 14 as discussed above. As a result, materials that might otherwise cause damage in the conventional syringe process can now be used, one such material being glass. By encasing conversion particles 22 in a rugged material such as glass, conversion particles 22 are better protected from contaminants in the ambient atmosphere that can undesirably react with particles 22 and reduce the usable lifetime of emitter 10. It should be understood that the lens 16 can be made of many different materials beyond glass, such as an epoxy or plastic, and the invention is not limited to the particular lens materials mentioned herein.

The manufacturing process also has the advantage that the light is emitted with a more uniform color, intensity, and temperature than provided by conventional manufacturing techniques. One reason better uniformity is achieved is because the light emitted from source 12 at different angles passes through similar thicknesses of lens 16 and, accordingly, through substantially similar amounts of conversion particles 22 since they are have substantially uniform distribution throughout region 21. For example, as shown in FIG. 2, light paths 1, 2, and 3 travels through substantially the same thickness of lens 16 and through substantially the same amount of conversion particles.

The uniformity of conversion particles 22 is better controlled since lens 16 is formed separately. The settling of conversion particles 22 can be avoided by quickly curing the material mixture after the mixture is injected into the mold or by shaking the injection mold during curing.

Another advantage is that conversion material region 21 does not generally contact light source 12, so variations in the surface or shape of light source 12 will not significantly impact the performance of emitter 10. Further, heat can damage or reduce the efficiency of conversion particles 22 if conversion material region 21 is positioned too close to light source 12.

Figure 3:
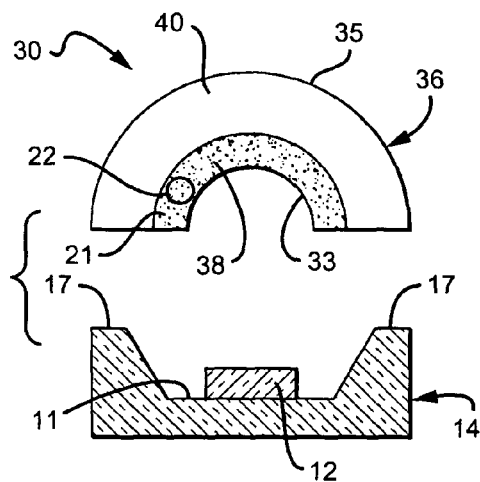
FIG. 3 is a sectional view of another embodiment of an emitter according to the present invention having a dome shaped phosphor-containing lens.
Figure 4:
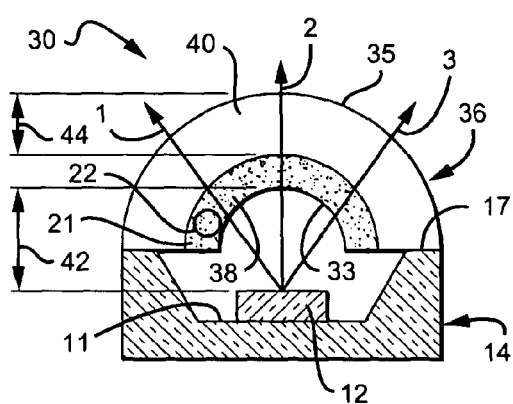
FIG. 4 is a sectional view of the emitter of FIG. 3, with the separate pieces bonded together.

FIGS. 3 and 4 illustrate an embodiment of an emitter 30 in accordance with the present invention. It should be noted that emitter 30 includes components similar to the components illustrated in FIGS. 1 and 2. Similar numbering is used on similar components with the understanding that the discussion above in conjunction with emitter 10 applies equally to emitter 30 and the other embodiments discussed in the rest of the disclosure.

Emitter 30 includes light source 12 mounted to submount 14. Filler material 19 can be positioned on surface 11 to surround light source 12, but is left out here and in the rest of the figures for simplicity and ease of discussion. Emitter 30 includes a lens 36 mounted to surface 17. Lens 36 includes an inside layer 38 with conversion particles 22 and an outside layer 40, where layers 38 and 40 preferably have uniform thicknesses throughout. Lens 36 is dome shaped and is positioned on surface 17 so that a portion of the light emitted from light source 12 flows through lens 36 from a surface 33 to a surface 35.

Conversion particles 22 are distributed throughout conversion material region 21. However, conversion material region 21 includes only a portion of lens 36. In particular, conversion particles 22 are distributed throughout inside layer 38 and preferably not within outside layer 40. Hence, inside layer 38 can include clear material mixed with conversion particles 22 and outside layer 40 can include clear material. In this arrangement, light emitted at different angles from light source 12 passes through nearly the same thickness of lens 36 and the same amount of conversion particles 22 (i.e. light paths 1, 2, and 3 are substantially equal).

By forming lens 36 in the shape of a dome, an inside distance 42 (See FIG. 4) can be maintained between light source 12 and inside layer 38 and conversion particles 22, with distance 42 being optimized for the particular light source 12 and submount 14. The optimum value for distances 42 and thickness 44 depends on the type and dimensions of light source 12 and submount 14. Distance 42 is chosen to allow for light source 12 to provide a higher intensity of light without exposing the conversion particles to excessive heat which can damage or reduce the efficiency of conversion particles 22.

Distance 42 can also affect the light efficiency of emitter 30. When light from light source 12 passes into inner layer 38, a portion of the directional light can be absorbed by conversion particles 22 and re-emitted omnidirectionally. If distance 42 is too small or if conversion particles 22 are positioned directly on light source 12, then the probability that some of the re-emitted light can be directed back into and absorbed by light source 12 is increased. The absorption of this light can reduce the overall light emitting efficiency of emitter 30. If distance 42 is too large, then thickness 44 can be reduced to a point that light from conversion particles 22 can be trapped in lens 36 by total internal reflection, which also reduces the overall efficiency of emitter 30.

Figure 5:
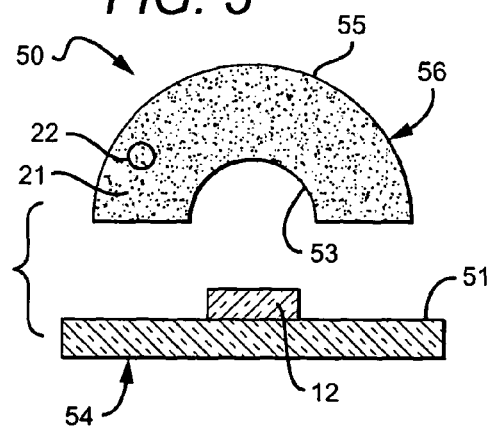
FIG. 5 is a sectional view of another embodiment of an emitter according to the present invention having a dome shaped phosphor-containing lens.
Figure 6:
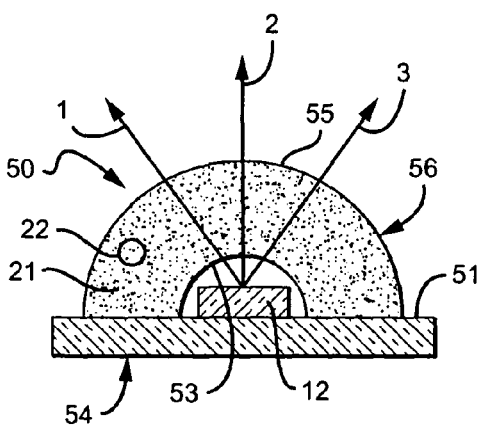
FIG. 6 is a sectional view of the emitter of FIG. 5 with the separate pieces bonded together.

FIGS. 5 and 6 illustrate an emitter 50 in accordance with the present invention, where emitter 50 includes a flat submount 54. In this embodiment, a dome shaped lens 56 is positioned over light source 12 and mounted to a surface 51 of submount 54, with light source 12 arranged in the space provided between an inside surface 53 of lens 56 and submount 54 (See FIG. 6). Light source 12 and inside surface 53 can be spaced apart such that the absorption by light source 12 of re-emitted light from conversion material regions 22 is minimized. Lens 56 includes conversion particles 22 distributed throughout lens 56 such that when light emitted from light source 12 passes through lens 56, a portion of it is absorbed by conversion particles 22 and re-emitted at a different wavelength.

FIGS. 7 and 8 illustrate an embodiment of an emitter 70 in accordance with the present invention. In this embodiment, emitter 70 includes a dome shaped lens 76 mounted to surface 51 of submount 54. Lens 76 includes an inside layer 78 which has clear material mixed with conversion particles 22 and an outside layer 80 which has clear material, preferably without any conversion particles. Light flow is from light source 12 through lens 76 from a surface 73 to a surface 75.

As discussed above in conjunction with FIGS. 3 and 4, an inside distance 82 is chosen between light source 12 and inside layer 78 to minimize the absorption of re-emitted light from conversion particles 22 into light source 12. Distance 82 and thickness 84 can be chosen to optimize the light efficiency of emitter 50 where the light efficiency is optimized by minimizing the absorption of the re-emitted light and by reducing the total internal reflection as discussed above.

FIGS. 9 and 10 illustrate an embodiment of an emitter 90 in accordance with the present invention where emitter 90 includes light source 12 mounted to surface 11 of submount 14. In this embodiment, a hemispheric shaped lens 96 is mounted to surface 17 where lens 96 includes a bottom layer 98 with conversion particles 22. However, in addition to conversion particles 22 being distributed throughout layer 98, layer 98 also includes scattering particles 100 for redirecting some of the light.

A portion of the light absorbed and re-emitted by conversion particles 22 in layer 98 is directed along layer 98, as shown by arrow 99 (See FIG. 10). This re-emitted light can be directed away from surface 95. Hence, one reason scattering particles 100 are included in layer 98 is to redirect the light towards surface 95 so that the light emitting efficiency of emitter 90 is increased.

The conversion and scattering efficiency of conversion particles 22 can depend on the wavelength of the light and the size of the conversion particles. Conversion material region 21 typically does not scatter light effectively because the conversion efficiency of particles 22 decreases as their size decreases. As a result, it is difficult to obtain high conversion efficiency particles that are smaller than approximately one micron in diameter. To effectively scatter light, the diameter of scattering particles 100 should be approximately one half of the wavelength of the light being scattered. In air, this would result in particles 100 being approximately 0.2 to 0.25 microns in diameter. This range of diameters would be smaller for particles in a different medium, such as epoxy or another material with an index of refraction greater than free space. As a result, phosphor particles are generally too large to effectively scatter light.

FIGS. 11 and 12 illustrate an embodiment of an emitter 110 in accordance with the present invention, where emitter 110 includes light source 12 mounted to a surface 111 of a submount 114. In this embodiment, a lens 116 is positioned on a surface 117 of submount 114 where lens 116 has a bottom layer 118 which includes conversion particles 22. Light flow is from light source 12 through lens 116 from a surface 103 to a surface 105.

Submount 114 includes a surface 101 and a surface 115 which are oriented to redirect light emitted from conversion particles 22 towards surface 105. Hence, bottom layer 118 does not have to include scattering particles similar to scattering particles 100 discussed above to scatter the re-emitted light from conversion particles 22. However, it should be noted that scattering particles 100 can still be included in layer 118, but are left out for simplicity and ease of discussion.

Surfaces 101 and 115 are shaped so light directed along layer 118 reflects off surfaces 101 and/or 117 and is combined with the light emitted from light source 12 that flows through layer 118 to surface 105. The light reflected from surfaces 101 and 115 can contribute to the light emitted by emitter 110. Hence, the light emission efficiency of emitter 110 is increased by including surfaces 101 and 115 in submount 114.

FIGS. 13 and 14 illustrate an embodiment of an emitter 130 in accordance with the present invention, where emitter 130 includes an LED 152 which can be shaped. In this embodiment, emitter 130 does not include a submount as in the embodiments discussed previously. Instead, emitter 130 includes contacts 134 and 135 arranged on the bottom of LED 152. Hence, LED 152 can be mounted in a metal cup with contacts 134 and 135 electrically connected to a bias source at the cup to provide power for the illumination of LED 152.

Instead of having a lens, emitter 130 includes a phosphor loaded cap 136 having the same basic shape as LED 152 and, preferably, having a generally consistent thickness. Cap 136 can be made of a similar material as the lenses described above and can include conversion particles distributed throughout. Cap 136 can be manufactured separately from LED 152 by the same methods as the lenses described above, one method being injection molding. Cap 136 can be mounted in place over LED 152 with a transparent epoxy or another similar material.

In operation, light emitting from LED 152 at different angles will pass through similar thicknesses of cap 136 and, accordingly, the light will encounter similar amounts of conversion particles 22 which allows emitter 130 to provide essentially the same color and intensity of light when viewed at different angles.

FIGS. 15 and 16 illustrate an embodiment of an emitter 150 in accordance to the present invention where emitter 150 includes LED 152 and a phosphor-loaded cap 154. In this embodiment, however, instead of including two bottom contacts, LED 152 has a bottom contact 156 and a top contact 158. Cap 154 has a top perforation 160 slightly larger than top contact 158 so that when cap 154 is bonded to LED 152, top contact 158 is arranged within, and accessible through, top perforation 160. Perforation 160 can be positioned anywhere along the phosphor cap, but is shown centered on the top for simplicity and ease of discussion.

The arrangement of top contact 158 allows an electrical signal to be provided to LED 152 through bottom and top contacts 156 and 158, respectively. For LED 150 as shown in FIG. 16, the electrical signal is provided to top contact 158 through conductor 162 which is wire bonded to contact 158. The electrical signal can also be provided to bottom contact 156 through a conductor (not shown) or through a metal cup.

Methods of Fabrication

Figure 17:
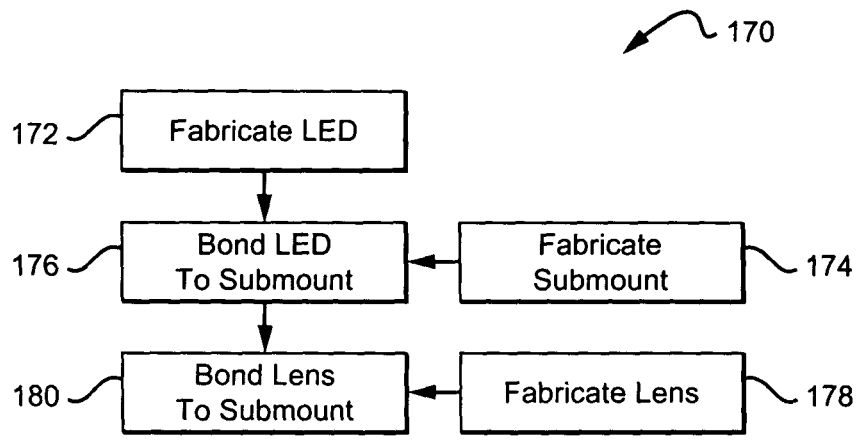
FIGS. 17 and 18 are flow diagrams illustrating methods of fabricating an emitter according to the present invention.

FIG. 17 is a flow diagram of one embodiment of an emitter fabrication method 170 according to the present invention, where the components of the emitter are fabricated separately and then bonded together. In a step 172, an LED is fabricated using any know method such as fabrication in a MOCVD reactor. In a step 174 the submount is fabricated and in step 176 the LED is bonded to the base of the submount using known bonding methods. In a step 178 the lens with conversion material region is fabricated using known fabrication methods such as injection molding. In a final step 180, the lens is bonded to the submount over the LED, with a preferred method being filling the space between the lens and submount/LED with an epoxy or another filler material, and contacting the inside surface of the lens to hold it in place.

In alternative intermediate steps (not shown), the emitter can be tested with the lens in place on the submount, but before it is bonded to the submount. If the emission of the emitter is substandard a determination can be made as to whether the LED or the lens is defective. The defective part can then be discarded and replaced with a new part. Bonding step 180 can occur after the testing process is repeated until the emitter operates efficiently.

Figure 18:
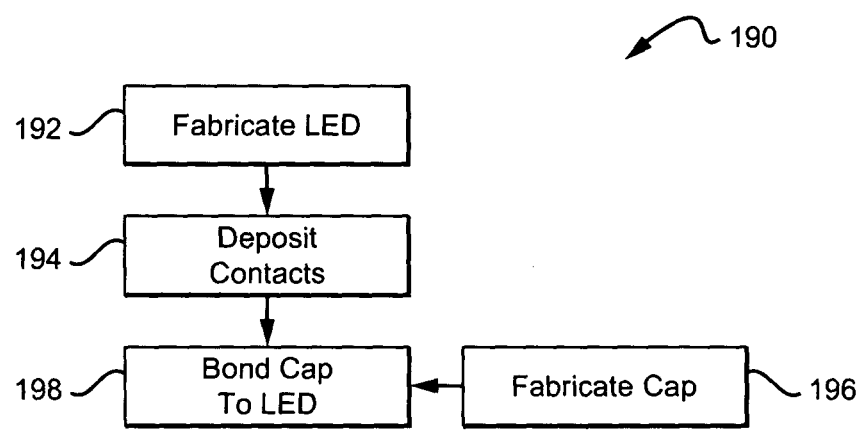

FIG. 18 is a flow diagram of another embodiment of an emitter fabrication method 190 in accordance with the present invention. In a step 192, an LED is fabricated using any known method such as fabrication in a MOCVD reactor, where the LED can be arbitrarily shaped. In a step 194 contacts are formed on the LED using known methods such as sputtering. In a step 196 a phosphor-loaded cap is fabricated using known methods, such as injection molding. In a step 198, the cap is mounted to the LED so that a portion of the LED light passes through the cap. The cap can be mounted to the LED using epoxy or another bonding material. In one method, the contacts are deposited on the bottom surface of the LED and the cap cover's the LED's top and side surfaces. In another method, a contact is deposited on the LED's bottom surface and another contact is deposited on the LED's top surface. The cap is perforated on its top surface and when it is bonded to the LED the top contact is housed in, and accessible through, the perforation.

The method can also include intermediate steps of testing the emitter before the cap is bonded to the LED. If either the cap or the LED are found to be defective, then the defective part can be discarded and replaced with a different part. The testing can be repeated until the emitter emits light at a sufficient color and intensity over a range of viewing angles before the cap is bonded to the LED.

Although the present invention has been described in considerable detail with reference to certain preferred configurations thereof, other versions are possible. The sequence of the steps in the methods described above can be different. Other methods according to the invention can use more or less steps and can use different steps. The lenses and caps described above can take many different shapes and layers and can include many different types of conversion particles. The lens and caps can be shaped to adapt to the particular application and can be shaped to focus the emitted light. Each of the lenses and caps described can also include scattering particles throughout or in different locations.

Therefore, the embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An emitter, comprising:
    a light source which emits a first spectrum of light; and
    a hemispheric conversion material region formed separately from said light source and including conversion particles distributed uniformly throughout said hemispheric conversion material region, said conversion material region mounted to a surface above and spaced apart from said light source and positioned in proximity to said light source such that at least some of said light source light passes through said conversion material region, said conversion material region shaped such that all of said light passing through travels through substantially the same thicknesses of said conversion material region, said conversion particles absorbing at least some of said light source light passing through said conversion material region and emitting a second spectrum of light,
    wherein said first spectrum of light and said second spectrum of light are combined within said conversion material region, said emitter emitting a combination of said first and second spectrums at a substantially uniform color and intensity.

2. The emitter of claim 1, wherein said light source emits said first spectrum of light along a plurality of light paths extending through said conversion material region, each light path extending through a substantially equal amount of conversion particles.

3. The emitter of claim 1, wherein said conversion material region includes scattering particles which redirect at least some of said first and second spectrum of light.

4. The emitter of claim 1, wherein said conversion material region comprises a glass lens.

5. The emitter of claim 4, wherein said glass lens is formed separately from said light source and bonded proximate to said light source.

6. The emitter of claim 1, wherein said conversion material region comprises a phosphor loaded cap.

7. The emitter of claim 6, wherein said phosphor loaded cap is shaped to fit closely over one or more of the surfaces of said emitter such that said light source light passing through said phosphor cap passes through substantially the same amount of said conversion particles.

8. The emitter of claim 6, wherein said phosphor loaded cap includes a perforation for receiving an electrical contact to said light source.

9. The emitter of claim 8, wherein said perforation is at least partially filled with at least one of conversion particles and scattering particles.

10. The emitter of claim 6, wherein said phosphor loaded cap is formed separately from said light source and bonded proximate to at least one of the surfaces of said light source.

11. The emitter of claim 1, further comprising a submount, said light source mounted to said submount and said conversion material region mounted to said submount.

12. The emitter of claim 1, wherein said conversion material region is hemispheric shaped and said light source emits light toward the base of and through said conversion material region.

13. The emitter of claim 1, wherein said light source comprises a light emitting diode.

14. The emitter of claim 1, emitting a spectrum of light that is a combination of said first and second spectrums of light.

15. The emitter of claim 1, wherein said conversion material region is positioned in relation to said light sources such that there is a space between the two.

16. An emitter, comprising:
a light source which emits a first spectrum of light, said light source comprising first and second electrical contacts on opposite surfaces of said light source; and
a conversion material region comprising an inside surface that is substantially the same shape as a plurality of outside surfaces of said light source, said conversion material region comprising a phosphor loaded cap perforated to allow said first contact to be housed within said phosphor loaded cap, said phosphor loaded cap comprising an uncovered top perforation slightly larger than said first contact, said first contact within the top perforation and accessible through the top perforation, said conversion material region formed separately from said light source and positioned on said light source, said conversion material region configured to absorb at least some of the light emitted by said light source and re-emit light at a second spectrum of light, said emitter emitting a combination of said first and second spectrums of light in a uniform third spectrum of light.

17. The emitter of claim 16, wherein said conversion material region is separable from said position on said light source.

18. The emitter of claim 16, further comprising a submount, wherein said light source is positioned on a first surface of said submount.

19. The emitter of claim 18, wherein said submount is configured to reflect some of said first and second spectrums of light.

20. The emitter of claim 18, wherein at least one of said submount surfaces reflects some of the first and second spectrums of light to said conversion material region.

21. The emitter of claim 18, wherein said submount includes one of a cup-shaped submount and a flat submount.

22. The emitter of claim 16, wherein said conversion material region comprises a phosphor loaded cap comprising substantially the same thickness throughout.

23. The emitter of claim 22, wherein the inside surface of said phosphor loaded cap is shaped to fit the shape of the majority of the outside surface of said light source.

24. The emitter of claim 22, wherein said phosphor loaded cap is formed separately from said light source and bonded to said light source.

25. The emitter of claim 16, wherein said conversion material region is positioned in relation to said light source such that there is a space between the two, said space chosen to obtain substantially uniform emission of said third spectrum of light.

26. The emitter of claim 16, wherein said conversion material region is positioned in relation to said light source such that there is a space between the two, said space chosen to provide said third spectrum of light with at least one of a desired color and intensity.

27. The emitter of claim 16, wherein said first contact is deposited on one of said outside surfaces of said light source.

28. A method of fabricating an emitter, comprising:
providing a light source;
providing a separately formed hemispheric conversion material region which includes conversion particles distributed uniformly throughout said hemispheric conversion material region; and
bonding said conversion material region proximate to said light source, said conversion material region mounted to a surface above and spaced apart from said light source and being positioned so that at least some of the light emitted from said light source at different angles flows through said conversion material region; and
said conversion material region being positioned such that all light flowing through said conversion material region passes through substantially the same thickness of said conversion material region.

29. The method of claim 28, further including a step of providing a submount, said light source being bonded to a first surface of said submount.

30. The method of claim 29, wherein the step of bonding said conversion material region proximate to said light source includes a step of bonding said lens to one of said first surface and a second surface of said submount.

31. The method of claim 29, wherein the step of providing said submount includes a step of providing one of a flat submount and a cup-shaped submount.

32. The method of claim 29, wherein said submount includes a cup-shaped submount with a third side configured to reflect at least a portion of the light re-emitted from said conversion material region.

33. The method of claim 28, wherein said conversion particles are distributed throughout said conversion material region so that said emitter emits light comprising a substantially uniform color distribution and/or a substantially uniform intensity.

34. The method of claim 28, wherein the step of providing said hemispheric conversion material region includes a step of providing a lens which includes said conversion material region.

35. The method of claim 34, wherein the step of providing said lens includes a step of providing a lens with an opening configured to allow said lens to at least partially surround said light source.

36. The method of claim 28, wherein the step of providing said conversion material region includes a step of providing a phosphor loaded cap comprising an inside surface that is shaped substantially the same as the outside surface of said light source.

37. The method of claim 36, wherein the step of providing said phosphor loaded cap includes a step of providing a phosphor loaded cap which is shaped to at least partially surround said light source.

38. The method of claim 36, wherein the step of providing said phosphor loaded cap includes a step of providing a phosphor loaded cap with a perforation for engaging a contact.

39. The method of claim 38, further including a step of filling said perforation with at least one of conversion particles and scattering particles.

40. An emitter, comprising:
a light source emitting a first spectrum of light; and
a substantially hemispherical lens element comprising a uniform distribution of wavelength conversion material dispersed throughout the substantially hemispherical lens element, said lens element molded separately from said light source and mounted to a surface above and spaced apart from said light source and proximate to said light source such that most of said light passes through said lens and such that all of the light passing through said lens over the entire range of angles passes through a substantially equal thickness of said lens element, wherein the light is transmitted from said lens element into the ambient;
wherein said emitter emits a second spectrum of light comprising substantially uniform color and intensity distributions over the entire range of viewing angles.

41. The emitter of claim 40, wherein said wavelength conversion material comprises phosphor conversion particles.

42. The emitter of claim 40, wherein said first spectrum comprises blue light and said second spectrum comprises blue and yellow light such that said second spectrum appears white to the human eye.

43. The emitter of claim 40, said lens element further comprising a perforation large enough to accommodate an electrical connection to said light source through said lens element.

44. The emitter of claim 43, wherein said perforation is at least partially filled with said wavelength conversion material.

* * * * *